United States Patent [19]
Sudoh et al.

[11] Patent Number: 5,442,768
[45] Date of Patent: Aug. 15, 1995

[54] RECORDING AND REPRODUCING DATA USING BATCH ERASABLE NONVOLATILE SEMICONDUCTOR MEMORIES CAPABLE OF SELECTIVELY ERASING ONE OF A PLURALITY OF DATA GROUPS STORED IN ONE OF THE MEMORIES

[75] Inventors: Kengo Sudoh, Higashihiroshima; Yuji Sumitomo, Yamatokouriyama, both of Japan

[73] Assignee: Sharp Kabushiki Kaisha, Osaka, Japan

[21] Appl. No.: 971,583

[22] Filed: Nov. 5, 1992

[30] Foreign Application Priority Data

Dec. 20, 1991 [JP] Japan .................................. 3-338746

[51] Int. Cl.⁶ .............................................. G06F 13/00
[52] U.S. Cl. ................................................... 395/430
[58] Field of Search ........................................ 395/425

[56] References Cited
U.S. PATENT DOCUMENTS 5,303,198  4/1994  Adachi et al. ...................... 365/218

FOREIGN PATENT DOCUMENTS

0477503A2  8/1991  European Pat. Off. .
0544252A2  11/1992  European Pat. Off. .
57-136269  8/1982  Japan .

*Primary Examiner*—David L. Robertson
*Attorney, Agent, or Firm*—Nixon & Vanderhye

[57] ABSTRACT

In a recording and reproducing apparatus, a plurality of data groups having arbitrary data capacities are recorded in and reproduced from a memory card formed of a plurality of batch erasable semiconductor memories having equal capacities. At least one of the plurality of semiconductor memories is set to be a spare memory which does not contain recorded data. To erase only one data group, those data groups (other than the data group to be erased) stored in the same semiconductor memory containing the data group to be erased are recorded in the spare memory. Individual index data and card index data including updated reproduction order data and rewrite number data are also recorded in the spare memory. Thereafter, the semiconductor memory containing the data group to be erased is batch-erased and becomes a new spare memory.

15 Claims, 4 Drawing Sheets

RECORDING AND REPRODUCING DATA USING BATCH ERASABLE NONVOLATILE SEMICONDUCTOR MEMORIES CAPABLE OF SELECTIVELY ERASING ONE OF A PLURALITY OF DATA GROUPS STORED IN ONE OF THE MEMORIES

BACKGROUND OF THE INVENTION

The present invention relates to a recording and reproducing apparatus, and in particular, to an audio recording and reproducing apparatus which carries out a recording operation in such a manner that analog signals obtained, e.g., through a microphone, are converted into digital signals and is recorded in a semiconductor memory, and also carries out a reproducing operation in such a manner that the digital signals recorded in the semiconductor memory are converted into the analog signals and output, e.g., through a loud speaker.

Cassette tape recorders using magnetic tapes, i.e., cassette tapes are well-known as apparatus for recording and reproducing sound. Such apparatus using the magnetic tape has advantages, for example, that the tape itself is inexpensive and that recording and reproducing for long time periods are allowed. However, since the apparatus requires a drive mechanism for moving the tape, it is difficult to reduce size and weight of the apparatus. Further, it disadvantageously requires a long access time because the recordings are accessed serially.

As an apparatus overcoming the above disadvantages, an audio recording and reproducing apparatus utilizing a semiconductor memory, instead of the magnetic tape, has been developed. The semiconductor memory has an access speed in the order of microseconds, which enables instantaneous queuing of a sound selection, and also reduces the size and weight because a tape driving mechanism is not required.

However, semiconductor memory is generally expensive and requires a power backup supply. These disadvantages are overcome by a nonvolatile, batch erasable memory which is relatively inexpensive and does not require the backup of the power supply. However, batch erasable memory erases all the sounds recorded therein, and it is impossible to selectively erase the recorded sound only in a specific region.

SUMMARY OF THE INVENTION

Accordingly, an object of the invention is to provide a flexible recording apparatus using a batch erasable nonvolatile semiconductor memory device.

Another object of the invention is to provide a recording apparatus that uses a batch erasable nonvolatile semiconductor memory device, in which only a specific data group can be erased.

In order to achieve the above-noted objects, the recording apparatus according to the invention includes a first memory formed of a batch erasable nonvolatile semiconductor memory device, a second memory formed of a batch erasable nonvolatile semiconductor memory device, a recording device for recording a data group selectively in the first memory and the second memory, an erasing device for selectively erasing the data groups recorded in the first and second memories, a first instruction device for instructing recording of a plurality of data groups in the first memory, a first control device for controlling the recording device to control the data groups in the first memory in response to an instruction output of the first instruction device, a second instruction device for instructing erasing of any one of the data groups recorded in the first memory, and a second control device for controlling the recording device to record the data groups other than the data group, of which erasing is instructed, in response to an instruction output of the second instruction signal and for controlling the erasing device to erase contents recorded in the first memory after completion of the recording in the second memory.

The recording apparatus thus constructed erases the recorded contents in the first memory after recording the data groups other than the data group to be erased in the second memory. Therefore, in spite of the fact that the semiconductor memory device is of the batch erasable type, only the specific data group can be erased, and thus flexibility is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
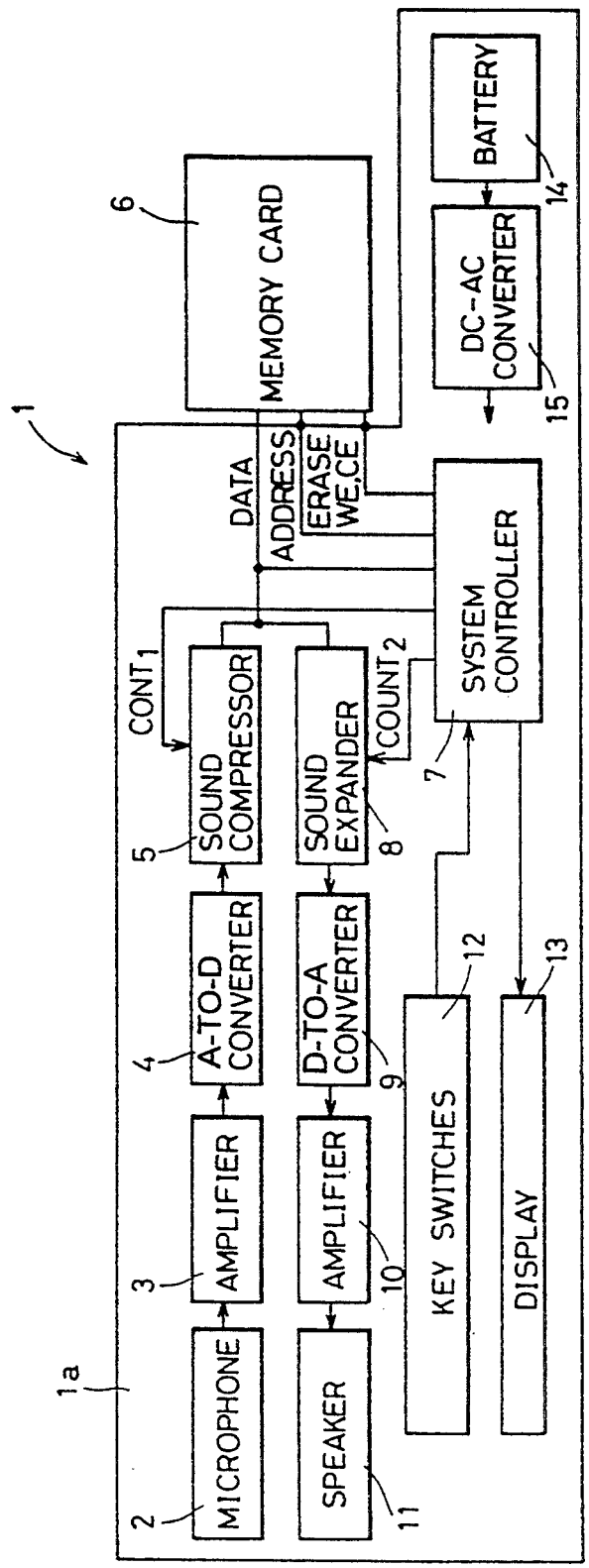
FIG. 1 is a system block diagram showing a basic construction of a recording and reproducing apparatus of an embodiment of the invention.

FIG. 1 is a block diagram showing a basic construction of a recording and reproducing apparatus 1 of an embodiment of the invention.

Referring to the figure, the recording and reproducing apparatus 1 includes a recording and reproducing main unit 1a, and a memory card 6 which is removably attached to the main unit 1a and serves as a recording medium for recording sound.

In the sound recording operation, the sound is converted by a microphone 2 into an electric signal (analog signal), which is amplified by an amplifier 3 and then is converted into a digital signal by an A to D (analog-to-digital) converter 4. If the digital signal were recorded in the memory card 6 in that form, however an expensive memory having a large capacity would be required. Therefore, the digital signal is compressed to several tenths or several twentieths by a sound compression circuit 5.

A system control circuit 7 controls the sound compression circuit 5 according to a control signal CONT1 to read the compressed data and to write the same in the memory card 6 at addresses sequentially designated by address signals. More specifically, the system control circuit 7 sequentially fetches the data from the sound compression circuit 5, and then writes the same in the memory card 6 at the addresses which are sequentially incremented, e.g., by one. The system control circuit 7 repeats the above write operation.

In the sound reproducing operation, the system control circuit 7 designates the address in the memory card 6, and operates to read the digital data at the designated address and supply the same to a sound expansion circuit 8. The sound expansion circuit 8 is controlled by a control signal CONT2 to restore the data compressed by the sound compression circuit 5. The digital sound signal is converted by a D-to-A (digital-to-analog) converter 9 to the analog sound signal, which is amplified by an amplifier 10 and is reproduced through a speaker 11. The system control circuit 7 applies signals CE, ERASE and WE, which will be described later, to the memory card 6, when necessary.

The operations for controlling the above recording and reproducing are started by depressing key switches 12 connected to the system control circuit 7. The key switches 12 include several keys such as record (REC) key, reproduction (PLAY) key, stop (STOP) key, forward feed (FF) key, rewind (REW) key, document mark (D-MARK) key and erase (ERASE) key. Operation states (e.g., document number, remaining time, etc.) of the recording and reproducing apparatus 1 are displayed on a display 13 formed, e.g., of a liquid crystal display. The main unit 1a is powered by a battery 14 through a DC-AC converter 15.

Operations for recording and reproducing one described below. For the recording operation, the record key among the key switches 12 is depressed, whereby the system control circuit 7 starts the recording of the sound detected by the microphone 2 in the memory card 6. If the document mark key is depressed during the recording, the sound data recorded before the depression, is treated as one data group forming one document, and index information (referred to as an "index") for identifying this document is also recorded in the memory card 6. In this manner, sound is recorded as one or more documents until the stop key is depressed.

For the reproducing operation, the reproduction key is depressed, whereby the sound data is read from the memory card 6 and is output through the speaker 11. The forward feed key or rewind key may be depressed to skip the data by document units. The feature of the recording and reproducing apparatus 1 using the memory card 6 is that forward feeding, i.e., skipping by document units as well as the rewinding, which also skips document units, can be executed instantaneously, i.e., in the order of microseconds.

Figure 2:
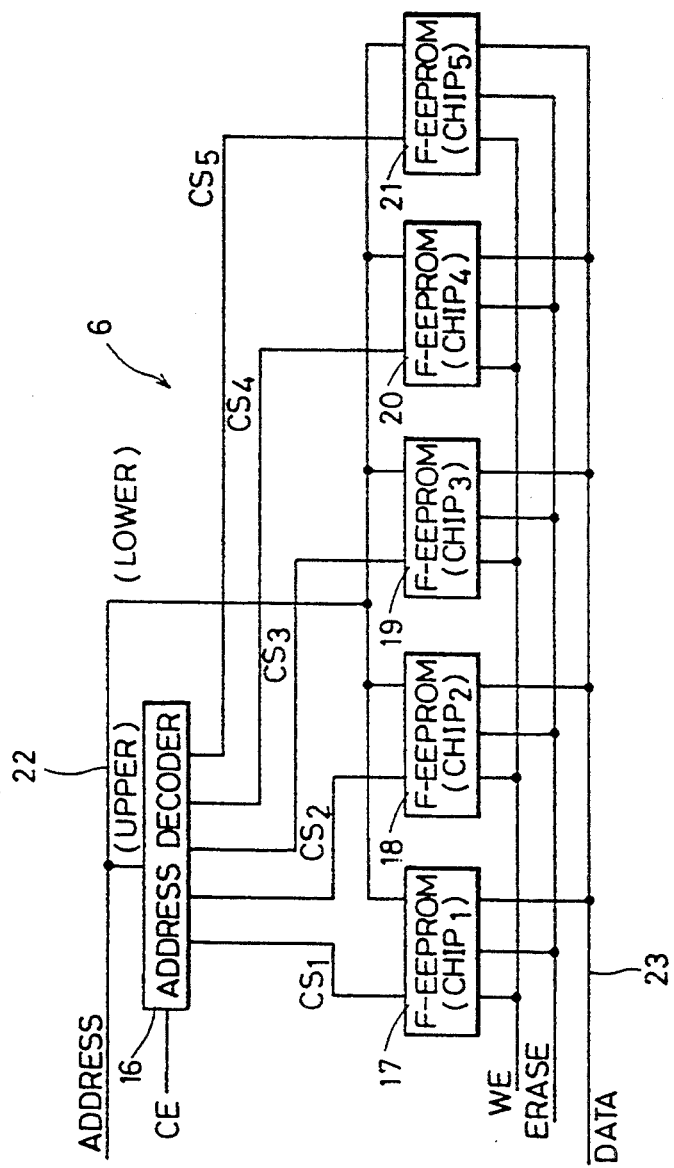
FIG. 2 is a block diagram showing a schematic construction of a memory card in FIG. 1.

FIG. 2 is a block diagram showing a construction of the memory card 6 in FIG. 1. The memory card 6 includes an address decoder 16, batch erasable and programmable read-only memories (will be referred to as "F-EEPROMs" hereinafter) 17-21, an address bus 22, and a data bus 23.

The address decoder 16 supplies chip select signals CS1–CS5 based on the higher addresses in the address signal received through the address bus 22 from the system control circuit 7. The chip select signals CS1–CS5 are exclusive to each other, and the data can be written in and read from a chip of which its chip select signal is true ("1"). The address decoder 16 receives a card enable signal CE, which isolates all the F-EEPROMs from the data bus 23. When the card enable signal CE is true ("1"), the address decoder 16 decodes the address signal so that the chip select signals CS1–CS5 become false ("0").

Each of the F-EEPROMs 17–21 (i.e., chips 1-5) receives, in parallel, lower addresses in the address signal through the address bus 22, the data DATA through the data bus 23, a write enable signal WE for the data writing, and an erase signal ERASE for the batch erasing of the data. As stated before, the F-EEPROMs 17–21 receive the chip select signals CS1–CS5 from the address decoder 16, respectively.

In the recording and reproducing apparatus 1 of the invention, the memory card 6 is formed of the five F-EEPROMs, four of which are used for recording and reproducing the sound data, and the remaining one is used as a spare memory.

Figure 3:
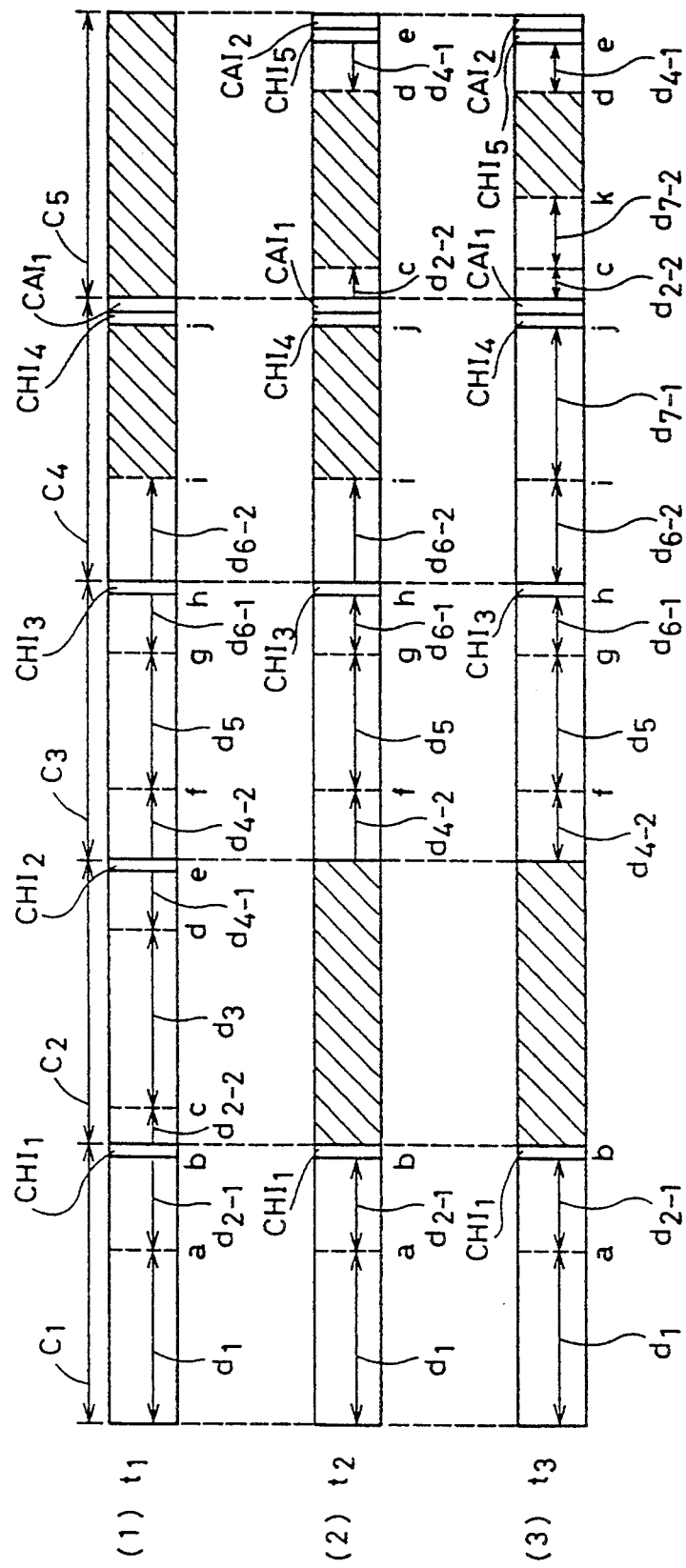
FIG. 3 shows recorded states, in timer series, of data of a memory card in FIG. 1.
Figure 4:
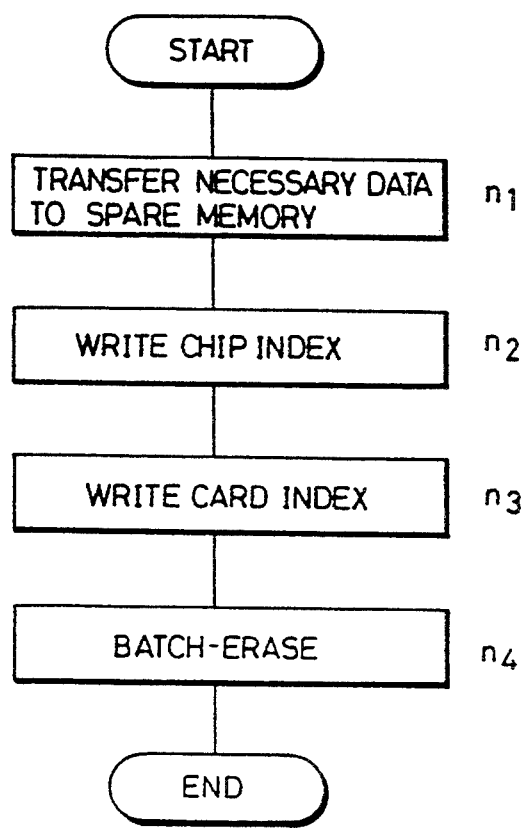
FIG. 4 is a flowchart showing operations for erasing a specific data group in a recording and reproducing apparatus in FIG. 1.
Figure 5:
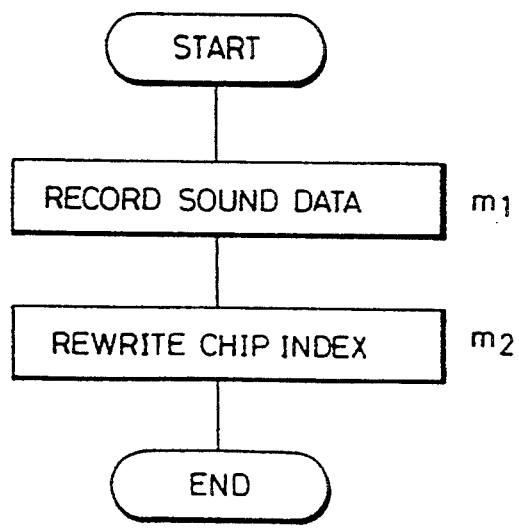
FIG. 5 is a flowchart showing operations for additional recording of data by a recording and reproducing apparatus in FIG. 1.

FIG. 3 shows recorded states of the data in the memory card 6 in FIG. 1, FIG. 4 is a flowchart showing an operation for erasing the data, and FIG. 5 is a flowchart showing an operation for additionally recording the data. Procedures for partially erasing and additionally recording the sound data will be described below with reference to FIGS. 3–5. In FIG. 3, (1) shows the recorded state of the data before erasing the data (time t1), (2) shows the recorded state of the data after erasing the data (time t2), and (3) shows the recorded state of the data after additionally recording the data (time t3).

Before the data erasing (time t1), as shown in FIG. 3(1), six documents d1–d6, i.e., sound data, are sequentially recorded at record regions C1–C4 of the chips 1–4. The document d2 is formed of a document d2-1 recorded in the record region C1 and a document d2-2 recorded in the record region C2. Similarly, each of the documents d4 and d6 is divided into two portions recorded in the different regions.

A record region C5 in the chip 5 is a spare record region and thus is an unrecorded region. The record regions C1–C4 include chip index regions CHI1–CHI4, in which individual index data to be referred to for the reproduction are recorded, respectively. Further, the record region C4 includes a card index region CAI, in which a total index data of the entire memory card 6 is recorded.

A following Table 1 represents contents of the chip index data and card index data at time t1. The chip index data is recorded in each chip, as described before, and the card index data is recorded in the chip, which contains the last recorded data, after the completion of a series of recording operations.

TABLE 1

| Rg | | E/Ad | S/Fl | E/Fl | N/No | N/Ad | D/Fl | W/No | Rp/Ord | R/No |
|----|---|------|------|------|------|------|------|------|--------|------|
| | | | | Chip Index | | | | | Card Index | |
| C1 | a | 1 | 1 | — | — | 1 | | | | 1 |
| | b | 1 | 0 | +1 | 0 | 1 | | | | 2 |
| C2 | c | 0 | 1 | — | — | 1 | | | | 3 |
| | d | 1 | 1 | — | — | 1 | | | | 4 |
| | e | 1 | 0 | +1 | 0 | 1 | | | | 5 |
| C3 | f | 0 | 1 | — | — | 1 | | | | 6 |
| | g | 1 | 1 | — | — | 1 | | | | 7 |
| | h | 1 | 0 | +1 | 0 | 1 | | | | 8 |
| C4 | i | 0 | 1 | — | — | 1 | | | | 9 |
| | j | — | — | — | — | 0 | | | | 10 |
| | — | — | — | — | — | — | 1 | 1,2,3,4 | 11 |
| C5 | — | — | — | — | — | — | — | — | 12 |

In the table 1, as well as tables 2 and 3 described later, "Rg" represents "region", "E/Ad" represents "end address", "S/Fl" represents "start flag", "E/Fl" represents "end flag", "N/No" represents "next number", "N/Ad" represents "next address", "D/Fl" represents "data flag", "W/No" represents "write number", "Rp/Ord" represents "reproduction order", and "R/No" represent "row number."

The chip index data includes end address data, start flag, end flag, next No. data, next address data and data flag. The end address data indicates a record terminating position of the document. The start flag and the end flag indicate whether the document is completed in the same chip or not. More specifically, the start flag indicates whether the record starting position of the document is in the same chip or not. The start flag is set at "1", if it is in the same chip, and is set at "0", if not. The end flag indicates whether the record terminating position of the document is in the same chip or not. The end flag is set at "1", if it is in the same chip, and is set at "0", if not.

The next No. data is a relative value indicating the chip to which the document not entirely stored in one chip continues. The next address data indicates the address in the chip designated by the next No. data to which that document continues. The data flag indicates whether the document part is the recorded part or the unrecorded part. The data flag is set at "1" if it is the recorded part, and is set at "0" if it is the unrecorded part.

The card index data includes reproduction order data and write No. (number) data. The reproduction order data indicates the order of record and reproduction of the chips, and corresponds to the next No. data in the chip index data. At time t1 shown in FIG. 3, the data is sequentially recorded in the chips starting from the chip 1, so that the reproduction order data is "1, 2, 3, 4". The write No. data indicates whether the card index data is the latest or not, and one is added to the write No. data each time the card index data is rewritten and renewed. In time line t1, since the recording is the first, the write No. data is "1".

At time t1 the document d1 is recorded at the addresses 0−a in the record region C1. Therefore, as indicated at the row number "1" in the table 1, the end address data of the chip index data is "a", start flag is "1", end flag is "1" and data flag is also "1".

The document d2 is divided into portions which are recorded at the addresses a+1−b in the record region C1 and at the addresses 0−c in the record region C2. Therefore, as indicated by the row number "2" in the table 1, the end address data is "b", start flag is "1", end flag is "0", next No. data is "+1", next address data is "0" and data flag is "1". Further, in the chip index data at the row number 3, the end address data is "c", start flag is "0", end flag is "1" and data flag is "1". The same is true with respect to the other documents d3–d6.

In the F-EEPROM, the data in each chip is batch-erased, e.g., by irradiation with ultraviolet rays. Therefore, if the above chip index data were written in the different chip, it would be necessary to correct the chip index data each time the data was erased, which would complicate the procedures for erasing the data. Conversely, according to the invention, each chip stores its own chip index data so that it is not necessary to correct the chip index data of the other chips. Thus the procedures for erasing the data. Further, provision of the write No. data in the card index data, indicating whether the card index data is the latest, eliminates the necessity of erasing the old card index data, which further simplifies the procedures for erasing the data.

Referring to FIGS. 3 and 4, the procedures for erasing the data will be described below. In this embodiment, description will be made in connection with the erasing of the document d3 shown at time t1.

In a step n1, documents d2-2 and d4-1, which are recorded in the record region C2, are recorded in the record region C5 which has been reserved as the spare record region. More specifically, the document d2-2 is recorded at the addresses 0−c in the record region C5, and the document d4-1 is recorded at the addresses d+1−e.

In step n2, the chip index data is written in the chip index region CHI5 of the record region C5. More specifically, as shown in a following table 2, various chip index data indicated by row numbers 12-14 is written in the chip index region of the record region C5.

TABLE 2

| | | Chip Index | | | | | Card Index | | |
|---|---|---|---|---|---|---|---|---|---|
| Rg | E/Ad | S/Fl | E/Fl | N/No | N/Ad | D/Fl | W/No | Rp/Ord | R/No |
| C1 | a | 1 | 1 | — | — | 1 | | | 1 |
| | b | 1 | 0 | +1 | 0 | 1 | | | 2 |
| C2 | — | — | — | — | — | — | — | — | 3 |
| | | | | | | | | | 4 |
| | | | | | | | | | 5 |
| C3 | f | 0 | 1 | — | — | 1 | | | 6 |
| | g | 1 | 1 | — | — | 1 | | | 7 |
| | h | 1 | 0 | +1 | 0 | 1 | | | 8 |
| C4 | i | 0 | 1 | — | — | 1 | | | 9 |
| | j | — | — | — | — | 0 | | | 10 |
| | — | — | — | — | — | — | 1 | 1,2,3,4 | 11 |
| C5 | c | 0 | 1 | 0 | d | 1 | — | — | 12 |
| | d | — | — | — | — | 0 | | | 13 |
| | e | 1 | 0 | +1 | 0 | 1 | | | 14 |
| | — | — | — | — | — | — | 2 | 1,5,3,4 | 15 |

Then, in step n3, the card index data is written in a card index region CAI2 of the record region C5. More specifically, as shown in the row number 15 in the table 2, since the necessary data has been transferred from the record region C2 to the record region C5, the reproduction order is "1, 5, 3, 4". Since this is the second writing of the card index data, the write No. data is "2".

Thereafter, at step n4, the data in the record region C2 of the chip 2 is batch-erased, and ultimately the record state becomes as shown at t2. Since the addresses c+1−d in the record region C5 are unrecorded parts, the data flag in the chip index data becomes "0", as shown by the row number 13 in table 2.

Subsequently, referring to FIGS. 3 and 5, the operation for additionally recording the data will be described below. In step m1 shown in FIG. 5, the document is recorded at the addresses i+1−j, i.e., in the unrecorded part of the record region C4, based on the reproduction order data of the card index data. At time t3, if the document d7 cannot be completely recorded in the unrecorded part of the record region C4, the document d7 will be subsequently recorded at the addresses c+1−d which are the unrecorded part of the record region C5.

In this embodiment, the document d7-1 is recorded at the addresses i+1−j of the record region C4, and the document d7-2 is recorded at the addresses c+1−k of the record region C5. The document d7 consists of the documents d7-1 and d7-2.

In step m2, correspondingly to the additionally recorded data, the chip index data to be set in the record region, in which the data is additionally recorded, is rewritten. Thus, the chip index data is rewritten as shown in a following table 3.

TABLE 3

| Rg | E/Ad | S/Fl | E/Fl | N/No | N/Ad | D/Fl | W/No | Rp/Ord | R/No |
|----|------|------|------|------|------|------|------|--------|------|
| C1 | a | 1 | 1 | — | — | 1 |   |         | 1 |
|    | b | 1 | 0 | +1 | 0 | 1 |   |         | 2 |
| C2 | — | — | — | — | — | — |   |         | 3 |
|    |   |   |   |   |   |   |   |         | 4 |
|    |   |   |   |   |   |   |   |         | 5 |
| C3 | f | 0 | 1 | — | — | 1 |   |         | 6 |
|    | g | 1 | 1 | — | — | 1 |   |         | 7 |
|    | h | 1 | 0 | +1 | 0 | 1 |   |         | 8 |
| C4 | i | 0 | 1 | — | — | 1 |   |         | 9 |
|    | j | 1 | 0 | −2 | c | 1 |   |         | 10 |
|    | — | — | — | — | — | — | 1 | 1,2,3,4 | 11 |
| C5 | c | 0 | 1 | 0 | d | 1 |   |         | 12 |
|    | d | — | — | — | — | 0 |   |         | 13 |
|    | e | 1 | 0 | +1 | 0 | 1 |   |         | 14 |
|    | k | 0 | 1 | — | — | 1 |   |         | 15 |
|    | — | — | — | — | — | — | 2 | 1,5,3,4 | 16 |

Note: Columns E/Ad, S/Fl, E/Fl, N/No, N/Ad, D/Fl are under "Chip Index"; W/No, Rp/Ord are under "Card Index"; R/No is the row number.

Since the document d7-1 is recorded at the addresses i+1−j in the record region C4, as described above, the chip index data at the row number 10 in the table 3 has such contents that the start flag is "1", end flag is "0", next No. data is "−2", next address data is "c" and data flag is "1". Moreover, since the document d7-2 is recorded at the addresses c+1−k in the record region C5, the chip index data corresponding to the row number 15 in the table 3 has such contents that the end address data is "k", start flag is "0", end flag is "1" and data flag is "1".

According to the embodiment, as described hereinabove, only the intended document, i.e., sound data need be erased in the recording and reproducing apparatus 1 using the batch erasable nonvolatile memory device. Further, the index data to be referred to for reproduction of the document is recorded in the same chip, and new card index data is written each time the data is erased. Therefore, the procedures for partially erasing the documents can be simplified.

The above embodiment utilizes five EEPROMs, one of which is used as the spare memory. However, the EEPROMs may be less or more than five in number, and two or more spare memories may be employed.

According to the invention, as described hereinabove, one of the multiple data groups is erased in the following manner. The data groups other than the data group to be erased in the same semiconductor memory are recorded in the spare memory. The individual index data as well as the total index data containing the renewed reproduction order data and the renewed rewrite number data are recorded in the spare memory. The semiconductor memory containing the data group to be erased is batch-erased and changed to the spare memory. Therefore, only one data group in the specific semiconductor memory is erased. In this operation, it is not necessary to rewrite the individual index data in the other semiconductor memories, and also it is not necessary to rewrite the total index data. Thus, only the specific data group can be erased, and only the minimum data needs rewriting. Therefore, data recording convenience and flexibility are significantly improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A recording apparatus comprising:
   a first batch erasable nonvolatile semiconductor memory;
   a second batch erasable nonvolatile semiconductor memory;
   a system controller for recording in said first and second memories data as one or more data groups, individual index data indicating a reproduction order of the first and second memories, and total index data including reproduction order data and rewrite number data indicating a number of times said reproduction order data has been rewritten,
   wherein when one of a plurality of data groups recorded in said first memory is to be erased, the system controller records data groups other than the data group to be erased in said second memory and thereafter erases the first memory.

2. A recording apparatus according to claim 1, wherein said memories include an EEPROM.

3. A recording apparatus according to claim 2, wherein said first and second memories include a memory card which is removably attached to said recording apparatus.

4. A recording apparatus according to claim 1 wherein a new data group is recorded in a region of the second memory in which the other data groups are not recorded.

5. A recording apparatus according to claim 4, wherein an order data indicative of a recording order of the respective recorded data groups is recorded in said second memory.

6. A recording apparatus according to claim 5 wherein the system controller sequentially reads the data groups recorded in said second memory in accordance with said order data.

7. A recording apparatus according to claim 6, wherein said data groups include sound data.

8. A recording apparatus according to claim 7 further comprising reproducing means-for reproducing the corresponding sound based on said read sound data.

9. A memory card which is removably attached to a recording and reproducing apparatus, comprising:
   a plurality of batch erasable nonvolatile semiconductor memories capable of recording a plurality of data groups; and
   a controller for recording in said memories data as one or more data groups, individual reproduction index data, and total index data including reproduction order data indicating a reproduction order of the memories and rewrite number data indicating a number of times said reproduction order data has been rewritten, said controller controlling said memories such that one of said memories is a spare memory.

10. A memory card according to claim 9, wherein said memories include an EEPROM.

11. A memory card according to claim 10, wherein said data groups include sound data.

12. A memory card according to claim 9, wherein said controller changes which of said memories is said spare based on a signal applied from said recording and reproducing apparatus.

13. A recording and reproducing apparatus, in which a plurality of data groups are recorded in and reproduced from a data memory formed of a plurality of batch erasable semiconductor memories wherein one of said plurality of semiconductor memories which does not contain the recorded data is set as a spare memory, said apparatus comprising:

a system controller for:

recording individual index data, which forms an index for reproduction of data, in each of said semiconductor memories, total index data including reproduction order data, which indicates a reproduction order of said plurality of semiconductor memories, and rewrite number data, which indicates the number of times of rewrite of said reproduction order data; wherein when only one of said data groups is to be erased, one or more data groups, other than the data group to be erased, in the semiconductor memory containing said data group to be erased is recorded in said spare memory, said individual index data as well as said total index data, of which reproduction order data and rewrite number data have been updated, are recorded in said spare memory, and said semiconductor memory containing said data group to be erased is batch-erased and changed into a new spare memory.

14. A method of comprising the steps of:

recording data groups in and reproducing data groups from a plurality of batch erasable semiconductor memories, wherein plural data groups are recorded in at least one memory, recording individual index data in each of the semiconductor memories;

recording total index data including a reproduction order from said semiconductor memories and rewrite number data indicating a number of times said reproduction order data has been rewritten; and selectively erasing one of said plural data groups from one of said semiconductor memories without erasing a remaining one of said plural data groups.

15. The method in claim 14, wherein the selectively erasing step includes:

recording the remaining data group in a spare one of said semiconductor memories, and thereafter, erasing the one data group from the one semiconductor memory.

* * * * *